United States Patent
Fujisawa et al.

(10) Patent No.: US 8,633,758 B2
(45) Date of Patent: Jan. 21, 2014

(54) SEMICONDUCTOR DEVICE HAVING BOOSTING CIRCUIT

(75) Inventors: Hiroki Fujisawa, Tokyo (JP); Shuichi Kubouchi, Tokyo (JP); Hitoshi Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 199 days.

(21) Appl. No.: 13/064,237

(22) Filed: Mar. 11, 2011

(65) Prior Publication Data

US 2011/0221513 A1    Sep. 15, 2011

(30) Foreign Application Priority Data

Mar. 12, 2010    (JP) .................................. 2010-055606

(51) Int. Cl.
*G05F 1/10*    (2006.01)
*G05F 3/02*    (2006.01)

(52) U.S. Cl.
USPC ......................................................... 327/536

(58) Field of Classification Search
USPC ..................... 327/536; 363/59–60
See application file for complete search history.

(56) References Cited

U.S. PATENT DOCUMENTS

| | | | | |
|---|---|---|---|---|
| 7,042,275 B2 * | 5/2006 | Suwa et al. | ................... | 327/536 |
| 7,564,297 B2 | 7/2009 | Nonaka | | |
| 7,663,960 B2 * | 2/2010 | Suzuki et al. | ................. | 365/226 |
| 7,990,205 B2 * | 8/2011 | Jung | ............................. | 327/536 |
| 2007/0262757 A1 * | 11/2007 | Kawagoshi | ................... | 323/265 |
| 2009/0115497 A1 * | 5/2009 | Takeyama | ..................... | 327/536 |

FOREIGN PATENT DOCUMENTS

JP    2008-79493    4/2008

* cited by examiner

*Primary Examiner* — Quan Tra
(74) *Attorney, Agent, or Firm* — McGinn IP Law Group, PLLC

(57) ABSTRACT

A semiconductor device includes a boosting circuit that boosts an internal power supply voltage in a boosting range according to an external power supply voltage, an external voltage-level comparison circuit that compares the external power supply voltage and a predetermined reference voltage, and a variable resistor circuit that includes a variable resistor connected to an output terminal of the boosting circuit. The variable resistor circuit controls a resistance value of the variable resistor based on a comparison result of the external voltage-level comparison circuit.

19 Claims, 11 Drawing Sheets

SEMICONDUCTOR DEVICE HAVING BOOSTING CIRCUIT

BACKGROUND OF THE INVENTION

1. Field of the Invention

The present invention relates to a semiconductor device, and, more particularly relates to a semiconductor device that prevents an internal power supply voltage from exceeding a tolerance value.

2. Description of Related Art

In semiconductor devices such as a DRAM (Dynamic Random Access Memory) and a FLASH memory, a boosting circuit is used for generating an internal power supply voltage from an external power supply voltage (see, for example, Japanese Patent Application Laid-open No. 2008-79493). The internal power supply voltage generated by the boosting circuit is supplied to internal circuits of the semiconductor device.

The boosting circuit is a circuit that performs a function of pulling up (boosting) the internal power supply voltage at clock cycles. A voltage level of the internal power supply voltage gradually drops due to consumption of electric charge by the internal circuits. However, even if the voltage level drops, it is pulled up by the boosting circuit. Consequently, on average, a constant voltage level is maintained.

A pull-up range (boosting range) of the internal power supply voltage by the boosting circuit depends on the external power supply voltage. That is, the higher the external power supply voltage, the larger the boosting range, and the lower the external power supply voltage, the smaller the boosting range.

SUMMARY

It has become necessary to intensify a supply capability of the boosting circuit along with upgrading the capacity and speed of recent semiconductor devices. Typically, a smoothing capacitor is provided on an output side of the boosting circuit to eliminate ripples. In case the supply capability of the boosting circuit is intensified, the ensuing increased ripples in the internal power supply voltage will necessitate a larger smoothing capacitor.

However, a larger capacitor requires a larger surface area. Therefore, a technique that enables to eliminate the ripples without having to use a larger smoothing capacitor is required. One such technique being studied by the present inventor(s) is insertion of a resistor on the output side of the boosting circuit. One of the objects for eliminating the ripples is to prevent damage to the internal circuits due to a supply of unnecessarily, high voltages. The insertion of the resistor causes a voltage drop due to resistance, and thus there is a reduced possibility of the internal circuits being supplied unnecessarily high voltages.

However, insertion of a resistor on the output side of the boosting circuit leads to an overall drop in the internal power supply voltage. Particularly when there is a drop in the external power supply voltage, an adequate internal power supply voltage may not be derived. Furthermore, the resistor consumes power, which is not preferable from the point of view of reduction of power consumption. Therefore, it is desired that, even when a resistor is inserted on the output side of the boosting circuit, an adequate internal power supply voltage is maintained in addition to reduction in the power consumption by the resistor.

In one embodiment, there is provided a semiconductor device comprising: a boosting circuit that boosts an internal power supply voltage in a boosting range according to an external power supply voltage; a comparison circuit that compares the external power supply voltage and a predetermined reference voltage; and a variable resistor circuit that includes a variable resistor connected to an output terminal of the boosting circuit, wherein the variable resistor circuit controls a resistance value of the variable resistor based on a comparison result of the comparison circuit.

According to the present invention, an adequate voltage can be maintained as an internal power supply voltage even when there is a decrease in an external power supply voltage; because, a resistance value of a variable resistor is controlled based on a comparison result of the external power supply voltage and a reference voltage. Moreover, because the resistance value of the variable resistor is optimized according to the external power supply voltage, power consumption by the resistor can be reduced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
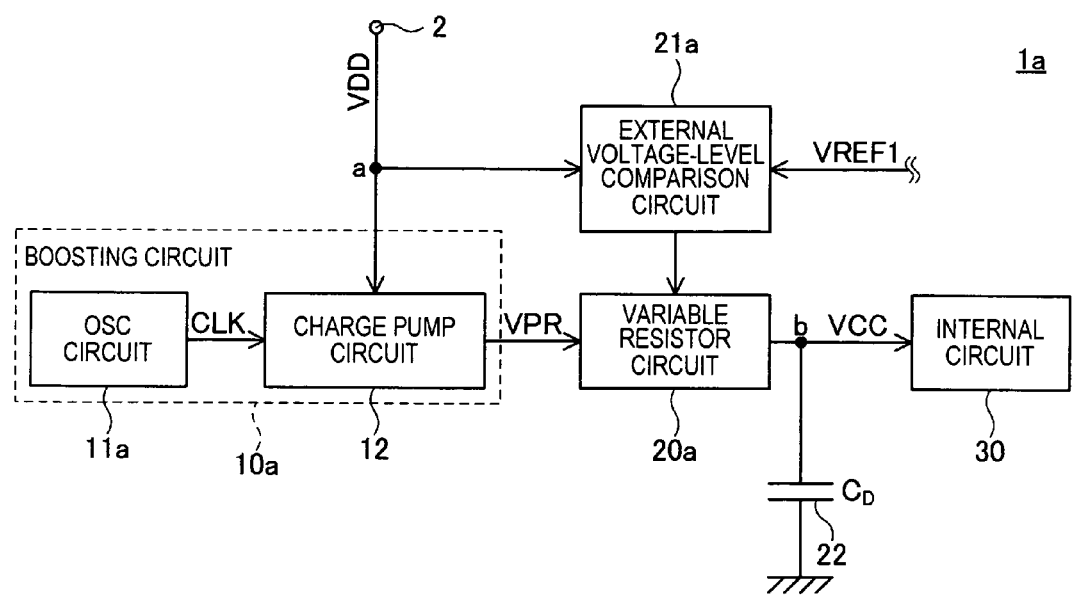
FIG. 1 is a schematic diagram indicating a functional block of a semiconductor device according to a first embodiment of the present invention.

FIG. 1 is a schematic diagram indicating a functional block of a semiconductor device 1a according to a first embodiment of the present invention.

The semiconductor device 1a, for example, is a semiconductor memory device such as a DRAM, a FLASH memory, and a PRAM (Phase change Random Access Memory). As shown in FIG. 1, the semiconductor device 1a includes a boosting circuit 10a, a variable resistor circuit 20a, an external voltage-level comparison circuit 21a, a capacitor 22, and an internal circuit 30. The semiconductor device 1a includes a power supply terminal 2 that serves as an external terminal and to which an external power supply voltage VDD is supplied. The semiconductor device 1a includes other types of terminals such as a command terminal, an address terminal, and a data input and output terminal; however, explanations of these terminals will be omitted.

The boosting circuit 10a and the external voltage-level comparison circuit 21a are connected to the power supply terminal 2 via an input node a, and each receives a supply of the external power supply voltage VDD from outside. The external voltage-level comparison circuit 21a additionally receives, from a not shown constant voltage source, a supply of a reference voltage VREF1 equal to a standard value of the external power supply voltage VDD.

The boosting circuit 10a is a circuit that uses the external power supply voltage VDD to generate a voltage VPR. Specifically, the boosting circuit 10a boosts an internal power supply voltage on every clock cycle/pulse in a boosting range according to the external power supply voltage VDD. This boosting operation is realized by an OSC (Oscillator) circuit 11a (clock circuit) and a charge pump circuit 12 shown in FIG. 1. Circuit configurations and operations of the OSC circuit 11a and the charge pump circuit 12 are explained later in detail.

The variable resistor circuit 20a includes, though not shown in FIG. 1, a variable resistor that is connected between an output terminal of the boosting circuit 10a and an output node b, and at least one switch element that controls a resistance value of the variable resistor. Because the resistor connected in the circuit causes a voltage drop, the voltage at the output node b (internal power supply voltage VCC) will be equivalent to a value obtained by subtracting the voltage drop due to the variable resistor from the output voltage VPR of the boosting circuit 10a. A circuit configuration and operations of the variable resistor circuit 20a are explained later in detail.

The external voltage-level comparison circuit 21a is a circuit that compares the external power supply voltage VDD and the reference voltage VREF1, and outputs a comparison result thereof to the variable resistor circuit 20a. The variable resistor circuit 20a controls the resistance value of the variable resistor based on the comparison result received from the external voltage-level comparison circuit 21a. A circuit configuration and operations of the external voltage-level comparison circuit 21a are explained later in detail.

The capacitor 22 is connected between the output node b and ground wiring lines (hereinafter, "ground potential") to which a ground potential is supplied. The capacitor 22 is a so-called smoothing capacitor and plays the role of removing ripples from the internal power supply voltage VCC. The capacitance of the capacitor 22 is hereinafter denoted by reference symbol $C_D$.

The internal circuit 30 is a circuit that realizes the principal function of the semiconductor device 1a, and operates on an operating power supply of the internal power supply voltage VCC supplied through the output node b. For example, if the semiconductor device 1a were a DRAM, the internal circuit 30 corresponds to a memory cell array or a peripheral circuit thereof.

In the first embodiment, assuming that a consumed current $I_L$ of the internal circuit 30 is constant, the variable resistor circuit 20a is provided to prevent unnecessarily high voltages from being supplied to the internal circuit 30 when the boosting circuit 10a boosts the internal power supply voltage VCC in the boosting range according to the external power supply voltage VDD under the assumed condition. This is explained in detail later.

The circuit configurations and the operations of the OSC circuit 11a, the charge pump circuit 12, the variable resistor circuit 20a, and the external voltage-level comparison circuit 21a are explained below in detail in this order.

Figure 2A:
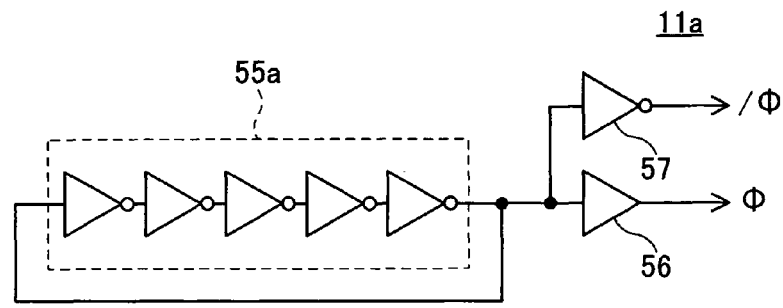
FIG. 2A shows the circuit configuration of the OSC circuit according to a first embodiment of the present invention.

FIG. 2A shows the circuit configuration of the OSC circuit 11a. As shown in FIG. 2A, the OSC circuit 11a includes a delay line 55a having an odd number (five in FIG. 2A) of inverters, a buffer 56, and an inverter 57. An output of the delay line 55a is feedback-connected to an input of the delay line 55a as well as being input into the buffer 56 and the inverter 57. Due to the above configuration, complementary clock signals Φ and /Φ are output from the buffer 56 and the inverter 57, respectively.

Figure 2B:
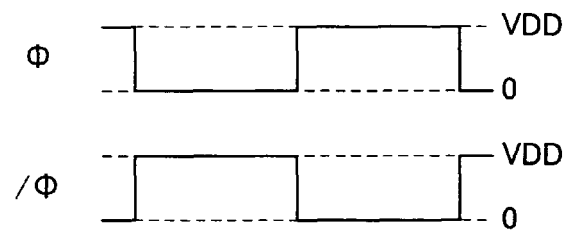
FIG. 2B is an example of the complementary clock signals according to a first embodiment of the present invention.

FIG. 2B is an example of the complementary clock signals Φ and /Φ. As shown in FIG. 2B, both the clock signals Φ and /Φ are rectangular signals with repeating lows and highs at predetermined intervals and with mutually reversed phases. Voltage values of the clock signals Φ and /Φ are determined according to operating power supply voltages of each of the inverters and the buffer 56 in the OSC circuit 11a. Although not shown in FIG. 2B, the operating power supply voltages of each of the inverters and the buffer 56 are set to the external power supply voltage VDD and the ground potential (which is 0). Accordingly, the voltage values of the clock signals Φ and /Φ are 0 at low and VDD at high.

Figure 2C:
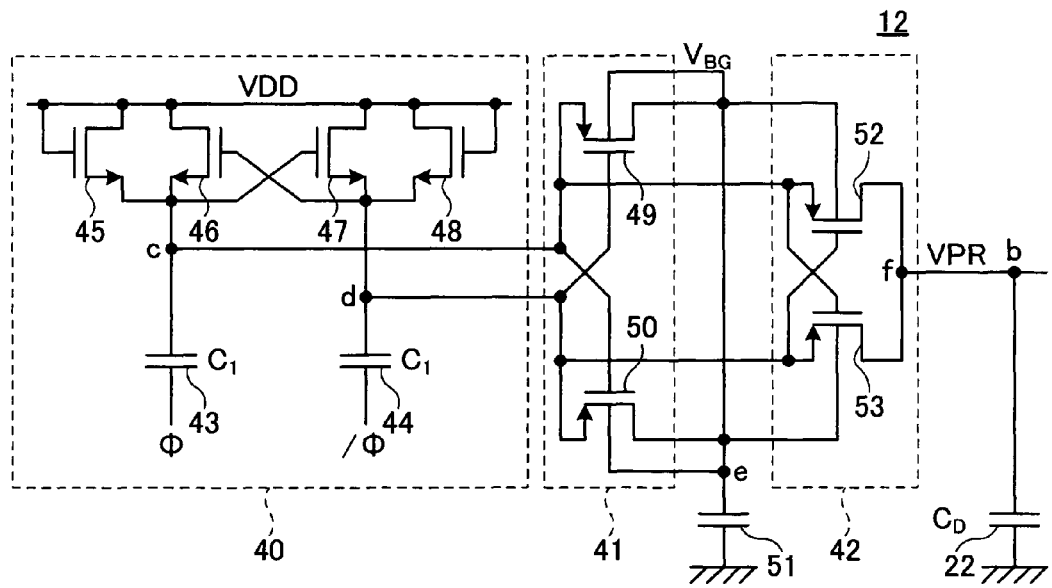
FIG. 2C shows the circuit configuration of the charge pump circuit according to a first embodiment of the present invention.

FIG. 2C shows the circuit configuration of the charge pump circuit 12. As shown in FIG. 2C, the charge pump circuit includes a booster circuit 40, a substrate potential generating circuit 41, and a transfer gate 42. Although not a constituent element of the charge pump circuit 12, the capacitor 22 (smoothing capacitor) of FIG. 1 is also shown in FIG. 2C.

The booster circuit 40 includes a capacitor 43 and a capacitor 44. The capacitor 43 is connected between power supply wiring lines to which the external power supply voltage VDD is supplied (hereinafter, the power supply wiring lines are simply referred to as "external power supply voltage VDD") and an input terminal of the clock signal Φ. The capacitor 44 is connected between the external power supply voltage VDD and an input terminal of the clock signal /Φ. The capacitors 43 and 44 both have the same capacitance of $C_1$. N-channel MOS transistors 45 and 46 are connected in parallel between the capacitor 43 and the external power supply voltage VDD, and N-channel MOS transistors 47 and 48 are connected in parallel between the capacitor 44 and the external power supply voltage VDD. In the following explanations, a connection point of the transistor 46 and the capacitor 43 is denoted by a node c and a connection point of the transistor 47 and the capacitor 44 is denoted by a node d. Gates of the transistors 45 and 48 are connected to the external power supply voltage VDD, a gate of the transistor 46 is connected to a drain of the transistor 47, and a gate of the transistor 47 is connected to a drain of the transistor 46.

The substrate potential generating circuit 41 includes P-channel MOS transistors 49 and 50. A gate of the transistor 49 is connected to the node d and a source of the transistor 49 is connected to the node c. A gate of the transistor 50 is connected to the node c and a source of the transistor 50 is connected to the node d. A drain and a back gate of the transistor 49 and a drain and a back gate of the transistor 50 are connected to each other, and between a connection point thereof, which is denoted by a node e, and the ground potential, a capacitor 51 is connected. In the following explanations, a potential of the node e is denoted by a substrate potential $V_{BG}$. In an initial state, the substrate potential $V_{BG}$ is a floating potential.

The transfer gate 42 includes P-channel MOS transistors 52 and 53. A gate of the transistor 52 is connected to the node d and a source of the transistor 52 is connected to the node c. A gate of the transistor 53 is connected to the node c and a source of the transistor 53 is connected to the node d. A drain of the transistor 52 and a drain of the transistor 53 are connected to each other. The output voltage VPR of the boosting circuit 10a is derived from a node f, which is a connection point of the transistors 52 and 53. The substrate voltage $V_{BG}$ is supplied to back gates of the transistors 52 and 53.

Due to the above-described operations of the booster circuit 40, the substrate potential generating circuit 41, and the transfer gate 42, the charge pump circuit 12 boosts the output voltage VPR using the external power supply voltage VDD. The operations of the booster circuit 40, the substrate potential generating circuit 41, and the transfer gate 42 are explained below in detail.

Assuming that the potential of the clock signal Φ is 0 and that of the clock signal /Φ is VDD immediately upon power activation, the potential at the node c is charged to a level of at least VDD-Vt due to the turning on of the transistor 45. Vt is a threshold voltage of the transistors 45 to 48. When the potentials of the clock signals Φ and /Φ switch to VDD and 0, respectively, the potential at the node c is boosted to a maximum of 2VDD-Vt. Because usually 2VDD-Vt is greater than or equal to VDD+Vt, the transistor 47 is fully turned on, and the node d of the capacitor 44 is charged to VDD.

When the potentials of the clock signals Φ and /Φ again switch to 0 and VDD, respectively, the potential at the node c is charged to a maximum of 2VDD. Due to this, the transistors 45 and 46 are turned on and the transistors 47 and 48 are turned off. The potential at the node c becomes VDD due to the turning on of the transistor 46. Upon subsequent repetition of the operation mentioned above, the potentials at the nodes c and d alternate between 2VDD on a high potential side and VDD on a low potential side. When the node c is at a high potential and the node d is at a low potential, the transistor 49 is turned on and the transistor 50 is turned off, and the substrate potential $V_{BG}$ becomes equal to the potential at the node c. At the same time, the transistor 52 is turned on and the transistor 53 is turned off, the nodes f and c are connected, and their potentials become equal to the output voltage VPR.

The output voltage VPR is explained below with a specific value. The capacitor 22 (smoothing capacitor) whose capacitance is $C_D$, is connected to an output side (output node b) of the charge pump circuit 12, as shown in FIG. 2C. In actuality, the variable resistor circuit 20a is inserted between the node f and the output node b, as shown in FIG. 1. However, its presence is ignored here, and the function of the variable resistor circuit 20a is explained later. It is also necessary in actuality to take into consideration the effect of the capacitor on the internal circuit 30. However, this fact is also ignored here. In such a case, when the potential of the clock signal Φ is VDD and the potential of the clock signal /Φ is 0, it is as though the capacitors 43 and 22 are connected in series between the external power supply voltage VDD and the ground potential.

Thus, the charge equivalent to VDD accumulated in the capacitor 43 and the charge supplied from the external power supply voltage VDD are distributed to the capacitors 22 and 43, and the output voltage VPR is determined by the charge distributed to the capacitors 22 and 43 and the consumed current $I_L$. Specifically, an average VPR (av.) of the output voltage VPR is determined by the following Expression (1).

$$VPR(av.) = 2 \cdot VDD - \frac{T}{2 \cdot C_1} \cdot I_L \cdot \left(1 + \frac{C_D}{C_D + C_1}\right) \cdot \frac{1}{2} \quad (1)$$

$$\cong 2 \cdot VDD - \frac{T}{2 \cdot C_1} \cdot I_L (C_D >> C_1)$$

Thus, as is understood from the Expression (1), the output voltage VPR increases as the external power supply voltage VDD increases, and falls as the consumed current $I_L$ increases. The variable resistor circuit 20a according to the first embodiment is provided to prevent a high output voltage VPR due to an increase in the external power supply voltage VDD from being input into the internal circuit 30.

Figure 3A:
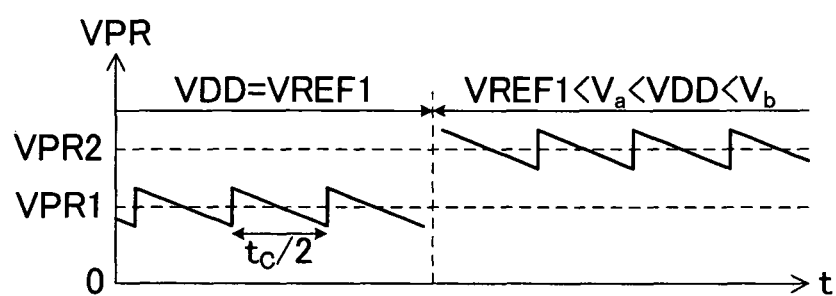
FIG. 3A shows an outline of a variation of the output voltage VPR against the external power supply voltage VDD in the first embodiment of the present invention.

FIG. 3A shows an outline of a variation of the output voltage VPR in the first embodiment. In FIG. 3A, the clock cycle is denoted by reference symbol $t_c$. As shown in FIG. 3A, when the external power supply voltage VDD is equal to the reference voltage VREF1, an average level of the node f becomes VPR1. When VREF1<$V_a$<VDD<$V_b$, an average level of the node f becomes VPR2, which is higher than VPR1. Voltages $V_a$ and $V_b$ are explained later.

As is understood from FIG. 3A and the Expression (1), when there is an increase in the external power supply voltage VDD due to fluctuation, there is a corresponding increase in the average value of the output voltage VPR. Thus, there are chances that the internal circuit 30 may receive unnecessarily high voltages due to an increase in the external power supply voltage VDD.

The circuit configurations and operations of the variable resistor circuit 20a and the external voltage-level comparison circuit 21a are explained below in detail.

Figure 4:
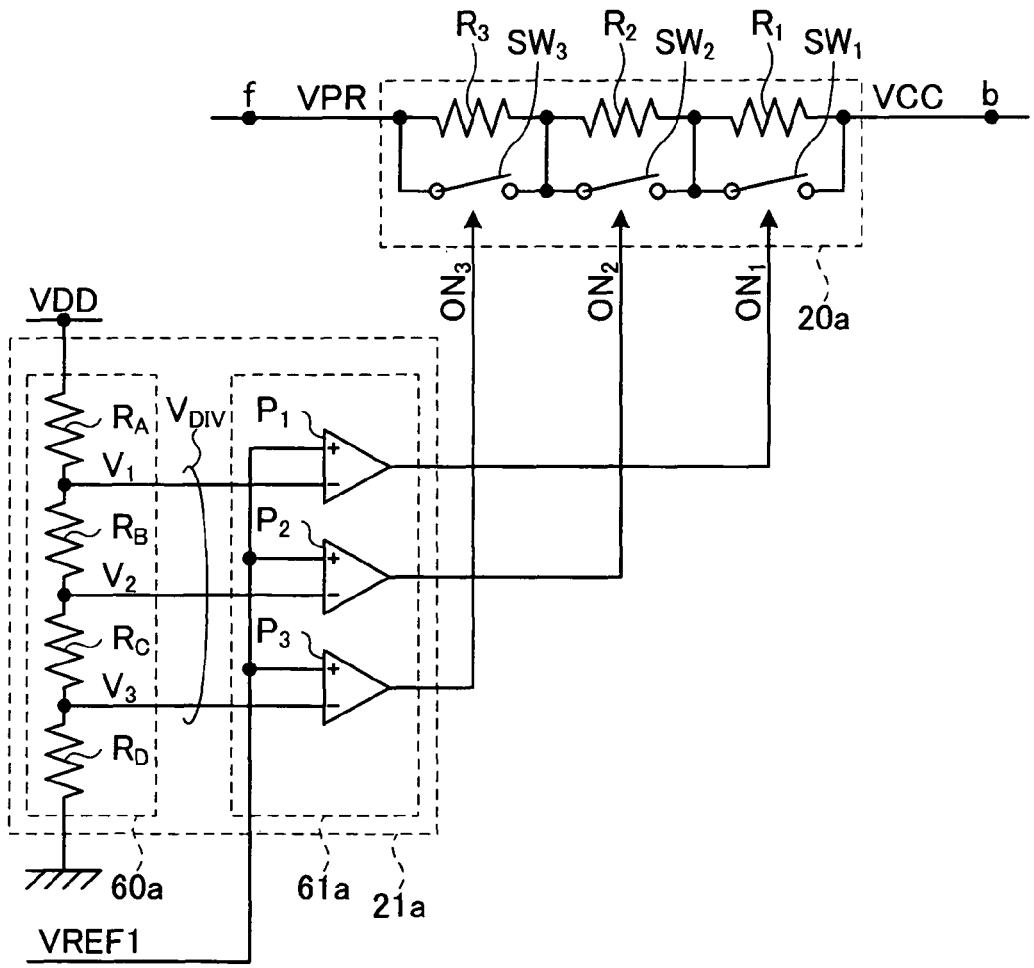
FIG. 4 shows the circuit configurations of the variable resistor circuit and the external voltage-level comparison circuit according to a first embodiment of the present invention.

FIG. 4 shows the circuit configurations of the variable resistor circuit 20a and the external voltage-level comparison circuit 21a. As shown in FIG. 4, the variable resistor circuit 20a includes three resistor elements $R_1$ to $R_3$ that are connected in series between the node f and the output node b shown in FIG. 2C, and switch elements $SW_1$ to $SW_3$ that are connected in parallel to the resistor elements $R_1$ to $R_3$, respectively. The external voltage-level comparison circuit 21a includes a voltage dividing circuit 60a that includes four resistor elements $R_A$ to $R_D$ connected in series between the external power supply voltage VDD and the ground potential, and a comparison circuit 61a that includes three comparators $P_1$ to $P_3$.

The external power supply voltage VDD is divided by the resistor elements $R_A$ to $R_D$ in the voltage dividing circuit 60a. Specifically, a divided voltage $V_1$ is derived from a connection point of the resistor elements $R_A$ and $R_B$, a divided voltage $V_2$ is derived from a connection point of the resistor elements $R_B$ and $R_c$, and a divided voltage $V_3$ is derived from a connection point of the resistor elements $R_c$ and $R_D$. A magnitude relation between the divided voltages $V_1$ to $V_3$ is $V_1 > V_2 > V_3$. The voltage that is output from the voltage dividing circuit 60a (divided voltages $V_1$ to $V_3$) is hereinafter collectively referred to as divided output voltage $V_{DIV}$.

The comparison circuit 61a compares the divided voltages $V_1$ to $V_3$ and the reference voltage VREF1 by using the comparators $P_1$ to $P_3$. Specifically, the comparator $P_1$ compares the divided voltage $V_1$ and the reference voltage VREF1, and if the divided voltage $V_1$ is lower than the reference voltage VREF1, makes a comparison result signal $ON_1$ active, and if not, makes the comparison result signal $ON_1$ inactive. Similarly, the comparator $P_2$ compares the divided voltage $V_2$ and the reference voltage VREF1, and if the divided voltage $V_2$ is lower than the reference voltage VREF1, makes a comparison result signal $ON_2$ active, and if not, makes the comparison result signal $ON_2$ inactive. Likewise, the comparator $P_3$ compares the divided voltage $V_3$ and the reference voltage VREF1, and if the divided voltage $V_3$ is lower than the reference voltage VREF1, makes a comparison result signal $ON_3$ active, and if not, makes the comparison result signal $ON_3$ inactive.

Figure 5A:
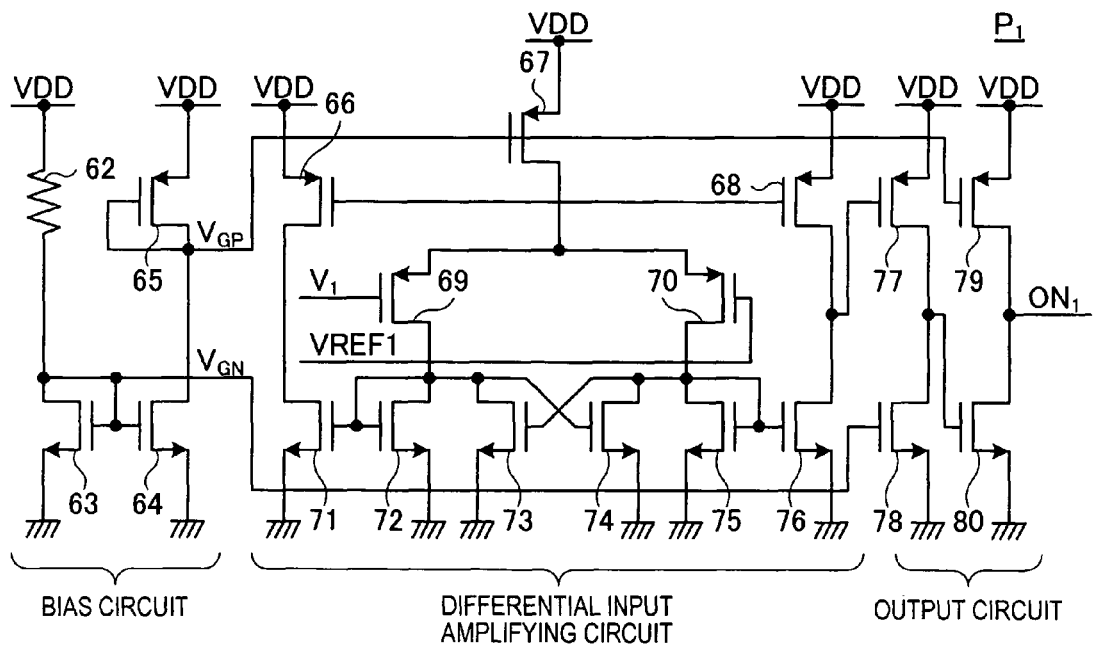
FIG. 5A shows a circuit configuration of the comparator according to a first and a second embodiment of the present invention.

FIG. 5A shows a circuit configuration of the comparator $P_1$. Circuit configurations of the comparators $P_2$ and $P_3$ are similar to that of the comparator $P_1$.

As shown in FIG. 5A, the comparator $P_1$ has a three level structure including a bias circuit, a differential input amplifying circuit, and an output circuit.

The bias circuit includes a resistor element 62, N-channel MOS transistors 63 and 64, and a P-channel MOS transistor 65, and generates and outputs bias voltages $V_{GN}$ and $V_{GP}$, which are constant voltages. In further detail, the resistor element 62 and the transistor 63 are connected in series between the external power supply voltage VDD and the ground potential. The transistors 65 and 64 are also connected in series between the external power supply voltage VDD and the ground potential. The transistors 63 and 65 are diode connected, and a gate of the transistor 63 and a gate of the transistor 64 are connected to each other. The bias voltages $V_{GP}$ and $V_{GN}$ are derived from drains of the transistors 65 and 63, respectively. Due to the above configuration, the bias voltages $V_{GN}$ and $V_{GP}$, which are constant voltages, are output from the drains of the transistors 63 and 65, respectively.

The differential output amplifying circuit includes P-channel MOS transistors 66 to 70 and N-channel MOS transistors 71 to 76, and performs a differential amplification of the divided voltage $V_1$ and the reference voltage VREF1. In further detail, the transistors 66 and 71 are connected in series between the external power supply voltage VDD and the ground potential. The transistors 68 and 76 are also connected in series between the external power supply voltage VDD and the ground potential. A source of the transistor 67 is connected to the external power supply voltage VDD. The transistors 69 and 72 are connected in series between a drain of the transistor 67 and the ground potential. The transistors 70 and 75 are also similarly connected in series between the drain of the transistor 67 and the ground potential. The transistor 73 is connected between a drain of the transistor 72 and the ground potential. The transistor 74 is connected between a drain of the transistor 75 and the ground potential.

The transistors 72 and 75 are diode connected. A gate of the transistor 66 and a gate of the transistor 68 are connected to each other. Similarly, a gate of the transistor 71 and a gate of the transistor 72 are connected to each other. Likewise, a gate of the transistor 75 and a gate of the transistor 76 are connected to each other. A gate of the transistor 73 is connected to a drain of the transistor 74 and a gate of the transistor 74 is connected to a drain of the transistor 73.

The divided voltage $V_1$ and the reference voltage VREF1 are input into gates of the transistors 69 and 70, respectively. The bias voltage $V_{GP}$ from the bias circuit is also input into a gate of the transistor 67. An output voltage (voltage obtained as a result of differential amplification) of the differential input amplifying circuit is derived from a connection point of the transistors 68 and 76.

When the divided voltage $V_1$ is lower than the reference voltage VREF1, the transistors 69, 72, 71, 66, and 68 are turned on, and the transistors 70, 75, and 76 are tuned off. As a result, the output voltage of the differential input amplifying circuit is equal to the external power supply voltage VDD. On the other hand, when the divided voltage $V_1$ is higher than the reference voltage VREF1, the transistors 70, 75, and 76 are tuned on whereas the transistors 69, 72, 71, 66, and 68 are turned off. As a result, the output voltage of the differential input amplifying circuit becomes equal to the ground potential. Thus, the output voltage of the differential input amplifying circuit becomes equal to the external power supply voltage VDD when the divided voltage $V_1$ is even slightly lower than the reference voltage VREF1 and becomes equal to the ground potential when the divided voltage $V_1$ is even slightly higher than the reference voltage VREF1, and is in effect, a value obtained by amplifying a difference between the divided voltage $V_1$ and the reference voltage VREF1. The transistors 73 and 74 are provided for giving hysteresis to the result of the differential amplification.

The output circuit includes P-channel MOS transistors 77 and 79 and N-channel MOS transistors 78 and 80, and generates and outputs the comparison result signal $ON_1$ that reflects the result of the differential amplification. Specifically, the transistors 77 and 78 are connected in series between the external power supply voltage VDD and the ground potential. Similarly, the transistors 79 and 80 are also connected in series between the external power supply voltage VDD and the ground potential. The output voltage from the differential input amplifying circuit is input into a gate of the transistor 77. The bias voltages $V_{GN}$ and $V_{GP}$ from the bias circuit are input into the transistors 78 and 79, respectively. A gate of the transistor 80 is connected to a connection point of the transistors 77 and 78, and the comparison result signal $ON_1$ is derived from a connection point of the transistors 79 and 80. Due to the above configuration, the comparison result signal $ON_1$ has the voltage of the external power supply voltage VDD (active state) when the divided voltage $V_1$ is lower than the reference voltage VREF1, and has the potential of the ground potential (inactive state) when the divided voltage $V_1$ is not lower than the reference voltage VREF1.

Referring back to FIG. 4, the comparison result signals $ON_1$ to $ON_3$ are input into the switch elements $SW_1$ to $SW_3$, respectively, in the variable resistor circuit 20a. The switch elements SW₁ to SW₃ are turned on when the comparison result signal being input is active and turned off when it is not active.

Figure 5B:
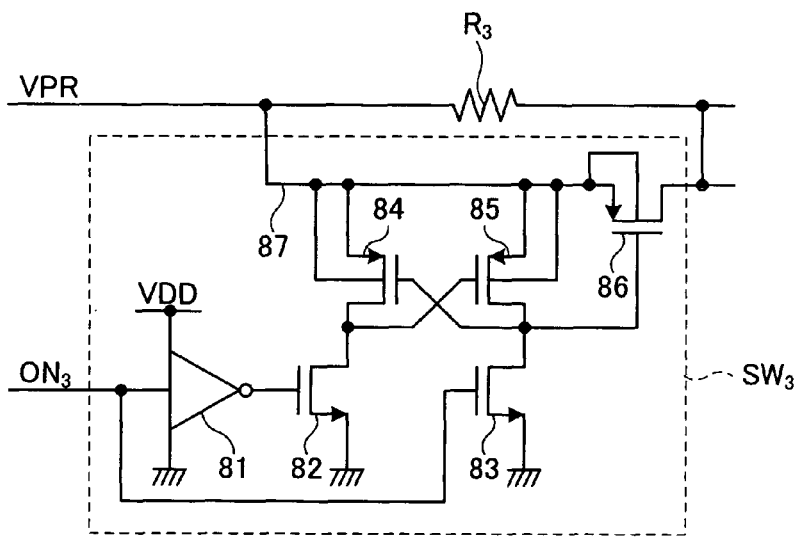
FIG. 5B shows a circuit configuration of the switch element according to a first and a second embodiment of the present invention.

FIG. 5B shows a circuit configuration of the switch element SW₃. Circuit configurations of the switch elements SW₁ and SW₂ are similar to that of the switch element SW₃.

As shown in FIG. 5B, the switch element SW₃ includes an inverter 81 that receives the external power supply voltage VDD and the ground potential as operating power supply, N-channel MOS transistors 82 and 83, P-channel MOS transistors 84 to 86, and a wiring 87 that is arranged in parallel with a corresponding resistor element R₃.

The comparison result signal ON₃ is input into the inverter 81 and a gate of the transistor 83. An output of the inverter 81 is input into a gate of the transistor 82. The transistors 84 and 82 are connected in series between the wiring 87 and the ground potential. Similarly, the transistors 85 and 83 are also connected in series between the wiring 87 and the ground potential. A gate of the transistor 84 is connected to a drain of the transistor 85 (a connection point of the transistors 85 and 83), and a gate of the transistor 85 is connected to a drain of the transistor 84 (a connection point of the transistors 84 and 82). Back gates of the transistors 84 and 85 are connected to the wiring 87. The transistor 86 is inserted in between the wiring 87, and a gate thereof is connected to the drain of the transistor 85.

With the above configuration, when the comparison result signal 0N₃ is active, that is, when the voltage of the comparison result signal ON₃ becomes equal to the external power supply voltage VDD, the transistors 82 and 85 are turned off, the transistors 83 and 84 are turned on, and the ground potential is supplied to the gate of the transistor 86. As a result, the transistor 86 is turned on, and the wiring 87 becomes conductive. That is, the resistor element R₃ is short-circuited. On the other hand, when the comparison result signal ON₃ is not active, that is, when the voltage of the comparison result signal ON₃ becomes equal to the ground potential, the transistors 82 and 85 are turned on, the transistors 83 and 84 are turned off, and the output voltage VPR is supplied to the gate of the transistor 86. As a result, the transistor 86 is turned off, and the wiring 87 is disconnected.

Figure 6A:
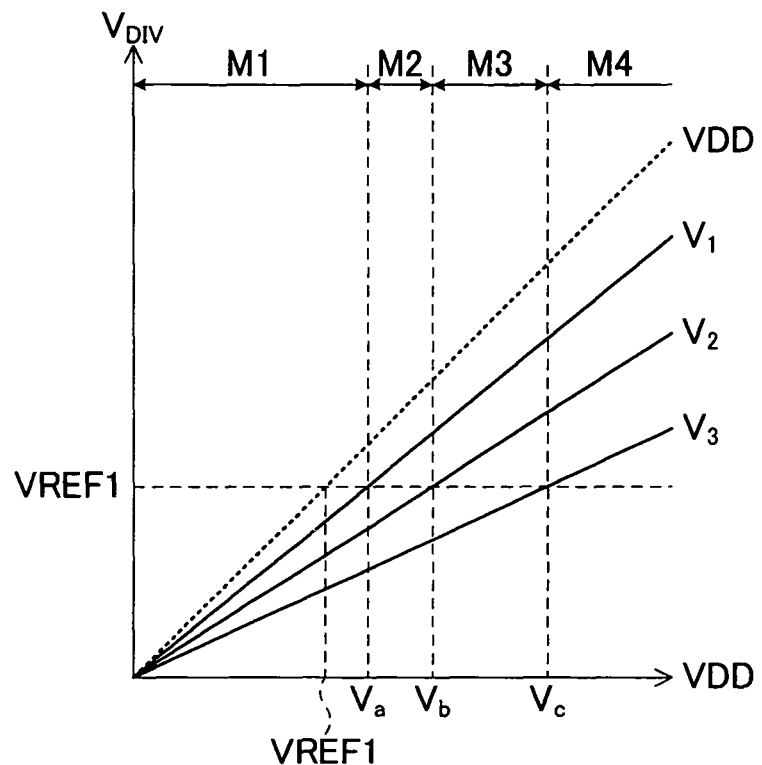
FIG. 6A is a graph showing a relation between the external power supply voltage VDD and the output voltage $V_{DIV}$ (divided voltages $V_1$ to $V_3$) of the voltage dividing circuit according to a first embodiment of the present invention.

FIG. 6A is a graph showing a relation between the external power supply voltage VDD and the output voltage $V_{DIV}$ (divided voltages $V_1$ to $V_3$) of the voltage dividing circuit 60a. In FIG. 6A, a horizontal axis represents the external power supply voltage VDD, and a vertical axis represents the output voltage $V_{DIV}$. As shown in FIG. 6A, when each of the divided voltages $V_1$ to $V_3$ is equal to the reference voltage VREF1, the external power supply voltage VDD is equal to voltages $V_a$ to $V_c$ ($V_a<V_b<V_c$). With the voltages $V_a$ to $V_c$, a correspondence can be established between an activation status of the comparison result signals ON₁ to ON₃ and the magnitude relation of the external power supply voltage VDD.

That is, when the comparison result signals ON₁ to ON₃ are all active (hereinafter, "first mode M1"), all the divided voltages $V_1$ to $V_3$ are lower than the reference voltage VREF1, and hence the external power supply voltage VDD will be lower than the voltage $V_a$. When the comparison result signal ON₁ is inactive, and the comparison result signals ON₂ and ON₃ are active (hereinafter, "second mode M2"), the value of the external power supply voltage VDD will be between the voltages $V_a$ and $V_b$. When the comparison result signals ON₁ and ON₂ are inactive, and the comparison result signal ON₃ is active (hereinafter, "third mode M3"), the value of the external power supply voltage VDD will be between the voltages $V_b$ and $V_c$. When the comparison result signals ON₁ to ON₃ are all inactive (hereinafter, "fourth mode M4"), the value of the external power supply voltage VDD will be higher than the voltage $V_c$.

Figure 6B:
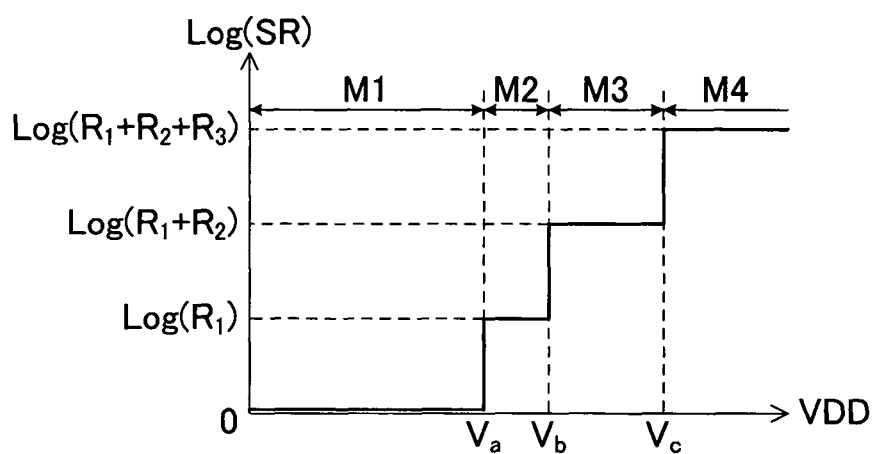
FIG. 6B is a graph showing a relation between the first to fourth modes M1 to M4 and a resistance value SR that is realized between the node f and the output node b due to the on/off status of the switch elements according to a first embodiment of the present invention.

FIG. 6B is a graph showing a relation between the first to fourth modes M1 to M4 and a resistance value SR that is realized between the node f and the output node b due to the on/off status of the switch elements SW₁ to SW₃. In FIG. 6B, a horizontal axis represents the external power supply voltage VDD and a vertical logarithmic axis represents the resistance value SR.

As shown in FIG. 6B, out of the four modes, the resistance value SR is the lowest, that is, substantially zero, in the first mode M1. This is compliant with all the resistor elements R₁ to R₃ being short-circuited due to the switch elements SW₁ to SW₃ being switched on. Due to the presence of wiring resistance or the like, the resistance value SR normally cannot be strictly zero. The resistance value SR is the second lowest in the second mode M2, and is substantially equal to a resistance value R₁ of the resistor element R₁ (a resistance value of a resistor element X is hereinafter denoted by X). This is compliant with the resistor element R₁ not being short-circuited due to the switch element SW₁ being turned off, and the resistor elements R₂ and R₃ being short-circuited due to the switch elements SW₂ and SW₃ being turned on. The resistance value SR is the third lowest in the third mode M3, and substantially equal to the sum of the resistance values R₁ and R₂ when the resistor elements R₁ and R₂ are connected in series. This is compliant with the resistor elements R₁ and R₂ not being short-circuited due to the switch elements SW₁ and SW₂ being turned off and the resistor element R₃ being short-circuited due to the switch element SW₃ being turned on. The resistance value SR is the highest in the fourth mode M4 and substantially equal to the sum of the resistance values R₁, R₂, and R₃, when the resistor elements R₁ to R₃ are connected in series. This is compliant with none of the resistor elements R₁ to R₃ being short-circuited due to the switch elements SW₁ to SW₃ being turned off.

In this manner, the resistance value SR between the node f and the output node b varies according to the mode of the variable resistor circuit 20a. Furthermore, because the resistance value SR increases as the external power supply voltage VDD increases, the value of the internal power supply voltage VCC can be decreased as the external power supply voltage VDD increases. As a result, the possibility of unnecessarily high voltages being supplied to the internal circuit 30 is reduced. Conversely, because the resistance value SR decreases as the external power supply voltage VDD decreases, an adequate voltage can be maintained as the internal power supply voltage VCC even when the external power supply voltage VDD decreases.

Figure 3B:
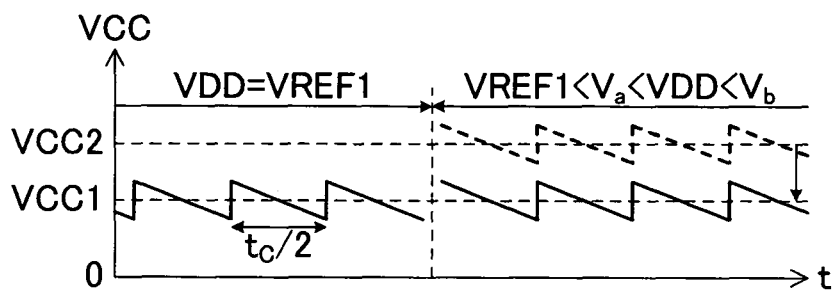
FIG. 3B is a schematic diagram showing a variation in the internal power supply voltage VCC output from the variable resistor circuit according to a first embodiment of the present invention.

FIG. 3B is a schematic diagram showing a variation in the internal power supply voltage VCC output from the variable resistor circuit 20a. In FIG. 3B, the variation in the internal power supply voltage VCC with the variation in the external power supply voltage VDD under the same conditions as in FIG. 3A is shown.

As can be understood by comparing FIGS. 3A and 3B, when the external power supply voltage VDD is equal to the reference voltage VREF1, the internal power supply voltage VCC becomes equal to the output voltage VPR (equal to VPR1 or VCC1). This is compliant with the mode of the variable resistor circuit 20a being the first mode M1, and the resistance value SR between the node f and the output node b being substantially zero. When the external power supply voltage VDD increases to a value between the voltages $V_a$ and $V_b$, the potential at the node f increases to VPR2, but the internal power supply voltage VCC at the output node b decreases as compared with VPR2. This is compliant with the mode of the variable resistor circuit 20a changing to the second mode M2, and the resistance value SR between the node f and the output node b becoming substantially equal to the resistance value $R_1$. That is, the decrease in the voltage occurs by the resistance value $R_1$. Specifically, the potential at the output node b is less than the potential at the node f by $R_1 \times I_L$. The potential at the output node b can be made equal to VCC1 by selecting an appropriate resistance value $R_1$.

As described above, in the semiconductor device 1a according to the first embodiment, when the external power supply voltage VDD increases, the resistance value SR increases, and therefore the possibility of unnecessarily high voltages being supplied to the internal circuit 30 reduces. On the other hand, when the external power supply voltage VDD drops, the resistance value SR reduces, and an adequate voltage can be maintained as the internal power supply voltage VCC. Furthermore, because an increase in the internal power supply voltage VCC with an increase in the external power supply voltage VDD is prevented, current consumption by the internal circuit 30 can be reduced.

Figure 7:
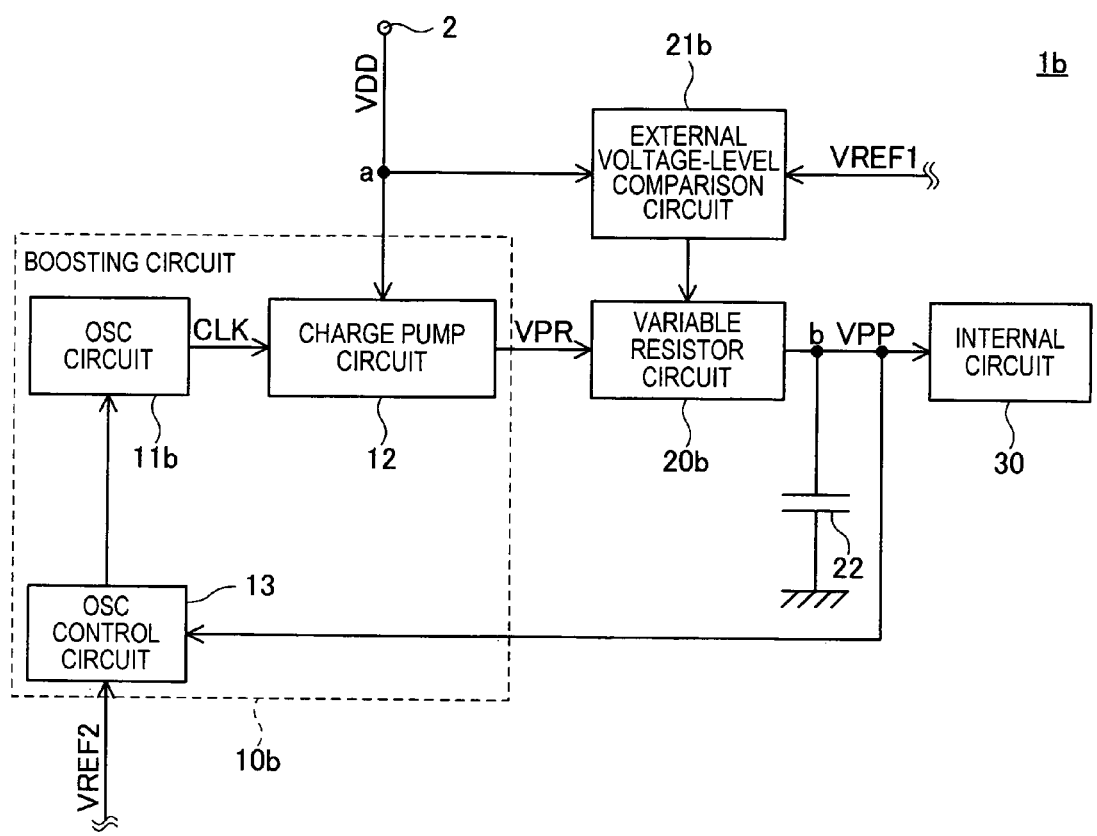
FIG. 7 is a schematic functional block diagram of a semiconductor device according to a second embodiment of the present invention.

FIG. 7 is a schematic functional block diagram of a semiconductor device 1b according to a second embodiment of the present invention.

As shown in FIG. 7, the semiconductor device 1b according to the second embodiment differs from the semiconductor device 1a according to the first embodiment in that it includes a boosting circuit 10b, a variable resistor circuit 20b, and an external voltage-level comparison circuit 21b instead of the boosting circuit 10a, the variable resistor circuit 20a, and the external voltage-level comparison circuit 21a. Moreover, a voltage at the output node b in the second embodiment is called an internal power supply voltage VPP. The parts of the second embodiment that are different from the first embodiment are mainly explained below.

The boosting circuit 10b differs from the boosting circuit 10a in that it includes an OSC circuit 11b instead of the OSC circuit 11a, and in addition, also includes an OSC control circuit 13. The boosting circuit 10b stops a boosting operation when the internal power supply voltage VPP exceeds a predetermined standard value VPPM due to operations of the OSC control circuit 13 and the OSC circuit 11b. As a result, even when the power consumption by the internal circuit 30 is low, the output voltage VPR is prevented from continuing to increase.

However, a certain amount of delay occurs from the time the internal power supply voltage VPP exceeds the standard value VPPM to the time the boosting operation is stopped by the charge pump circuit 12. The occurrence of delay itself is unavoidable due to the configuration of the boosting circuit 10b, and thus there is a possibility that the internal power supply voltage VPP may become too high during the delay period. The variable resistor circuit 20b according to the second embodiment is provided with an object of preventing the internal power supply voltage VPP from increasing excessively due to the delay. Each of the circuits is explained below in detail.

Figure 8:
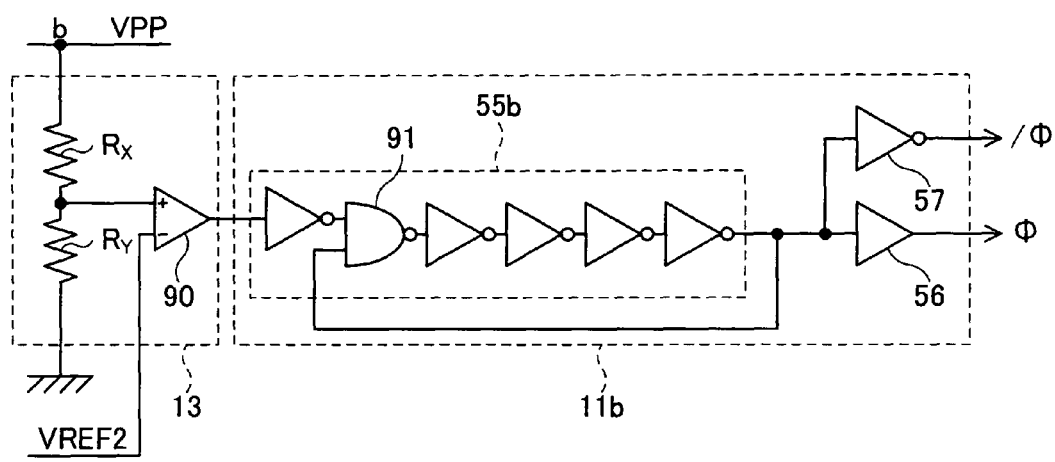
FIG. 8 shows circuit configurations of the OSC circuit and the OSC control circuit according to a second embodiment of the present invention.

FIG. 8 shows circuit configurations of the OSC circuit 11b and the OSC control circuit 13.

The OSC control circuit 13 includes resistor elements $R_X$ and $R_Y$, and a comparator 90. The resistor elements $R_X$ and $R_Y$ are connected in series between the output node b (internal power supply voltage VPP) and the ground potential. A non-inverting input terminal of the comparator 90 is connected to a connection point of the resistor elements $R_X$ and $R_Y$. Due to this configuration, a divided voltage $VPP \times R_Y/(R_X+R_Y)$ of the internal power supply voltage VPP is input into the non-inverting input terminal of the comparator 90. A reference voltage VREF2 that has a predetermined voltage value is input from a not shown constant voltage source into an inverting input terminal of the comparator 90.

The comparator 90 is a circuit that compares the divided voltage $VPP \times Ry/(Rx+Ry)$ of the internal power supply voltage VPP and the reference voltage VREF2. When the divided voltage $VPP \times Ry/(Rx+Ry)$ of the internal power supply voltage VPP is higher than the reference voltage VREF2, an output of the comparator 90 is at a high level, otherwise the output of the comparator is at a low level. The comparator $P_1$ shown in FIG. 5A can be used to represent a circuit configuration of the comparator 90.

Assuming a voltage value of the reference voltage VREF2 to be $VPPM \times R_Y/(R_X+R_Y)$, the comparison result of the internal power supply voltage VPP and the standard value VPPM are reflected in the output of the comparator 90.

Next, the OSC circuit 11b has a configuration similar to that of the OSC circuit 11a of FIG. 2A, except that the delay line 55a is replaced with a delay line 55b. The delay line 55b has an odd number of inverters (five in FIG. 8) as does the delay line 55a, but differs from the delay line 55a in that it has a NAND circuit 91 between a first level inverter and a second level inverter.

An output of the first level inverter and an output of the delay line 55b are input into the NAND circuit 91. Thus, when the output of the first level inverter is at a high level, the delay line 55b functions similar to the delay line 55a and repeatedly outputs high level signals and low level signals. As a result, the output of the OSC circuit 11b will be complementary clock signals Φ and /Φ as shown in FIG. 2B. On the other hand, when the output of the first level inverter is at a low level, the output of the NAND circuit 91 is always at a low level. Consequently, the output of the delay line 55b will also always be at a low level, and the outputs of the buffer 56 and the inverter 57 will always beat a low level and a high level, respectively. That is, the OSC circuit 11b stops the output of the complementary clock signals Φ and /Φ.

The output of the comparator 90 is input into the first level inverter. Thus, when the internal power supply voltage VPP is higher than the standard value VPPM, a high level signal is input into the first level inverter, and the OSC circuit 11b stops the output of the complementary clock signals Φ and /Φ. In this case, the charge pump circuit 12 stops the boosting operation, and the internal power supply voltage VPP decreases with power consumption by the internal circuit 30 or the like. On the other hand, when the internal power supply voltage VPP is lower than the standard value VPPM, a low level signal is input into the first level inverter, and the output of the OSC circuit 11b will be the complementary clock signals Φ and /Φ as shown in FIG. 2B. In this case, the charge pump circuit 12 performs the boosting operation as explained in the first embodiment.

Figure 9:
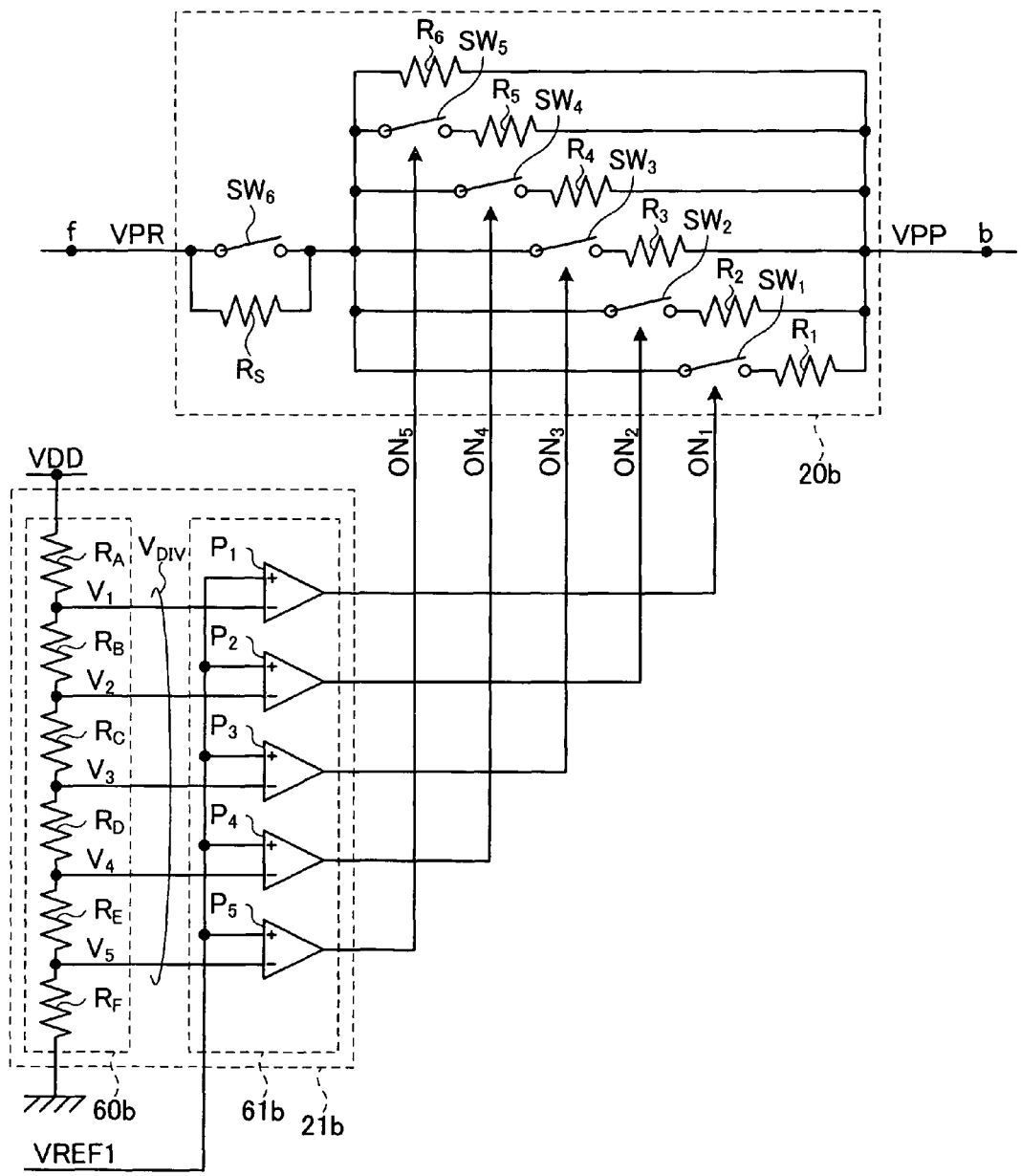
FIG. 9 shows circuit configurations of the variable resistor circuit and the external voltage-level comparison circuit according to a second embodiment of the present invention.

FIG. 9 shows circuit configurations of the variable resistor circuit 20b and the external voltage-level comparison circuit 21b.

As shown in FIG. 9, the variable resistor circuit 20b includes resistor elements $R_1$ to $R_6$ and $R_S$ and switch elements $SW_1$ to $SW_6$. The resistor elements $R_1$ to $R_6$ are connected in parallel between the node f and the output node b, and the resistor element $R_S$ is inserted between the resistor elements $R_1$ to $R_6$ and the node f. The switch elements $SW_1$ to $SW_5$ are connected in series, respectively, to the resistor elements $R_1$ to $R_5$, and the switch element $SW_6$ is connected in parallel to the resistor element $R_S$. The external voltage-level comparison circuit 21b includes a voltage dividing circuit 60b that includes six resistor elements $R_A$ to $R_F$ connected in series between the external power supply voltage VDD and the ground potential, and a comparison circuit 61b that includes five comparators $P_1$ to $P_5$.

The external voltage-level comparison circuit 21b differs from the external voltage-level comparison circuit 21a in that it divides the external power supply voltage VDD five ways (into divided voltages. $V_1$ to $V_5$) with the six resistor elements $R_A$ to $R_F$, and outputs five comparison result signals (comparison result signals $ON_1$ to $ON_5$) corresponding to the divided voltages $V_1$ to $V_5$. The external voltage-level comparison circuit 21b is similar to the external voltage-level comparison circuit 21a in other respects and therefore explanations thereof will be omitted.

The comparison result signals $ON_1$ to $ON_5$ are input into the switch elements $SW_1$ to $SW_5$, respectively, in the variable resistor circuit 20b. The switch elements $SW_1$ to $SW_5$ are turned on when the comparison result signal being input is active and turned off when it is not active. The switch element $SW_6$, on the other hand, is turned off when a load current flowing in the output node b is lower than a predetermined value, and turned on otherwise. When the load current is lower than the predetermined value, it indicates that the internal circuit 30 is in a standby mode. That is, the switch element $SW_6$ is turned off when the internal circuit 30 is in the standby mode, and turned on during a normal operation. The specific configurations of each of the switch elements $SW_1$ to $SW_6$ are similar to those explained in the first embodiment with reference to FIG. 5B.

Figure 10A:
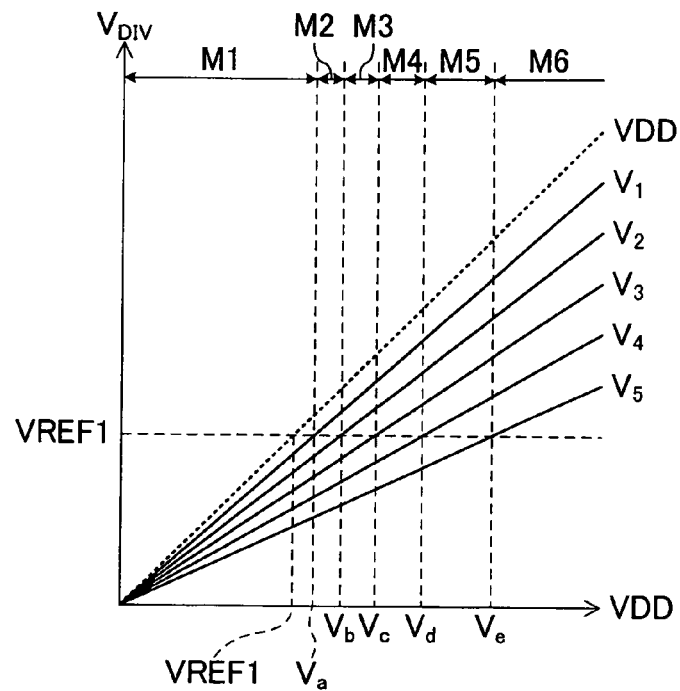
FIG. 10A is a graph showing a relation between the external power supply voltage VDD and output voltages $V_{DIV}$ of the voltage dividing circuit (divided voltages $V_1$ to $V_5$) according to a second embodiment of the present invention.

FIG. 10A is a graph showing a relation between the external power supply voltage VDD and output voltages $V_{DIV}$ of the voltage dividing circuit 60b (divided voltages $V_1$ to $V_5$). The vertical axis and the horizontal axis are the same as in FIG. 6A. As shown in FIG. 10A, when each of the divided voltages $V_1$ to $V_5$ is equal to the reference voltage VREF1, the external power supply voltage VDD is equal to voltages $V_a$ to $V_e$ ($V_a$<$V_b$<$V_c$<$V_d$<$V_e$). As in the first embodiment, the activation status of the comparison result signals $ON_1$ to $ON_5$ of the variable resistor circuit 20b changes with the voltages $V_a$ to $V_e$ as threshold values in the second embodiment. A combination of the activation statuses of the comparison result signals $ON_1$ to $ON_5$ corresponding to the external power supply voltage VDD in an ascending order thereof is hereinafter referred to as first mode M1 to sixth mode M6.

Figure 10B:
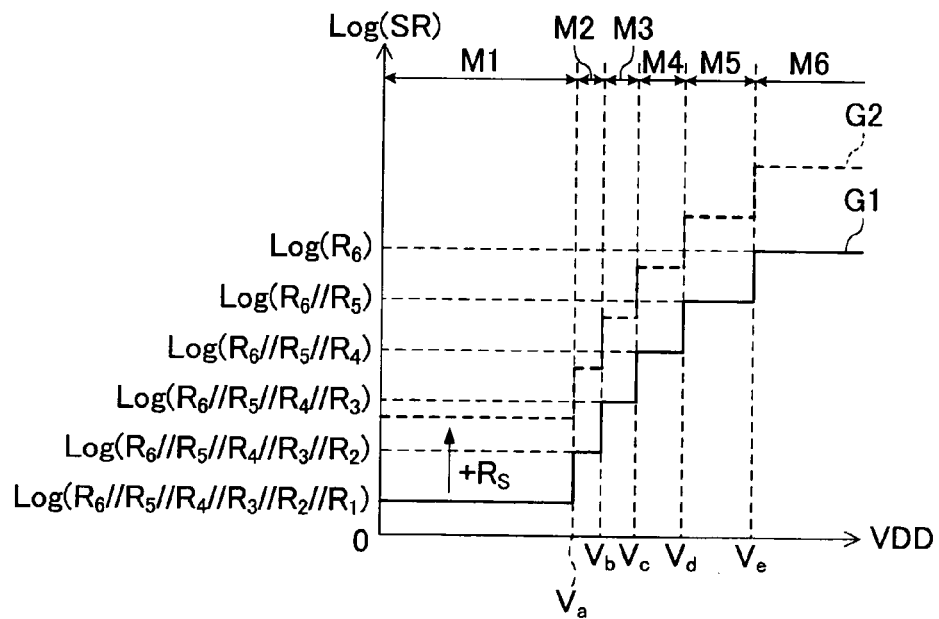
FIG. 10B is a graph showing a relation between the first to sixth modes M1 to M6 and the resistance values SR that are realized between the node f and the output node b due to the on/off status of the switch elements according to a second embodiment of the present invention.

FIG. 10B is a graph showing a relation between the first to sixth modes M1 to M6 and the resistance values SR that are realized between the node f and, the output node b due to the on/off status of the switch elements $SW_1$ to $SW_5$. The vertical axis and the horizontal axis are the same as in FIG. 6B.

The graphs G1 and G2 of FIG. 10B represent the instances when the switch element $SW_6$ is on (the internal circuit 30 is in a normal operation) and off (the internal circuit 30 is in the standby mode). The resistance values SR in the various modes shown in FIG. 10B are shown in Table 1 given below. In Table 1, the symbol // is an operator that determines a combined resistance of the resistors connected in parallel. For example, the combined resistance of the resistors X and Y connected in parallel becomes:

$$X//Y=1/(1/X+1/Y).$$

TABLE 1

| Mode | Resistance value SR (when switch element $SW_6$ is on) | Resistance value SR (when switch element $SW_6$ is off) |
| --- | --- | --- |
| M1 | $R_6//R_5//R_4//R_3//R_2//R_1$ | $R_6//R_5//R_4//R_3//R_2//R_1 + R_s$ |
| M2 | $R_6//R_5//R_4//R_3//R_2$ | $R_6//R_5//R_4//R_3//R_2 + R_s$ |
| M3 | $R_6//R_5//R_4//R_3$ | $R_6//R_5//R_4//R_3 + R_s$ |
| M4 | $R_6//R_5//R_4$ | $R_6//R_5//R_4 + R_s$ |
| M5 | $R_6//R_5$ | $R_6//R_5 + R_s$ |
| M6 | $R_6$ | $R_6 + R_s$ |

In this manner, also in the second embodiment, the resistance value SR between the node f and the output node b varies according to the mode of the variable resistor circuit 20b. Furthermore, because the resistance value SR increases as the external power supply voltage VDD increases, the value of the internal power supply voltage VPP can be decreased as the external power supply voltage VDD increases. As a result, the possibility of unnecessarily high voltages being supplied to the internal circuit 30 is reduced. Conversely, because the resistance value SR decreases as the external power supply voltage VDD decreases, an adequate voltage can be maintained as the internal power supply voltage VPP even when the external power supply voltage VDD decreases.

The resistance value SR also varies according to an operation status of the internal circuit 30. This reflects that in the standby mode, the power consumption by the internal circuit 30 becomes less, and thus the internal power supply voltage VPP can easily increase. Therefore, in the standby mode, the resistance value SR increases so that the possibility of unnecessarily high voltages being supplied to the internal circuit 30 is reduced. Conversely, because the resistance value SR during a normal operation is low, an adequate internal power supply voltage VPP can be maintained during a normal operation.

Figure 11A:
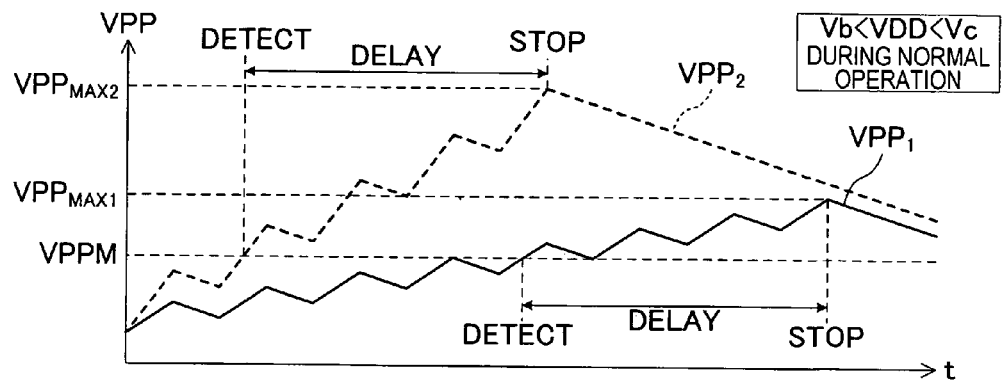
FIGS. 11A to 11C show an outline of the variation of the internal power supply voltage VPP output by the variable resistor circuit according to a second embodiment of the present invention.
Figure 11B:
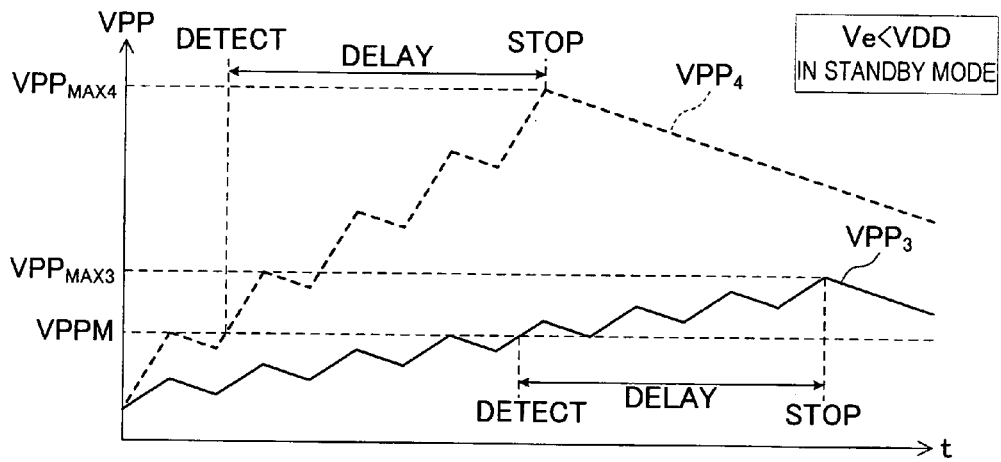
Figure 11C:
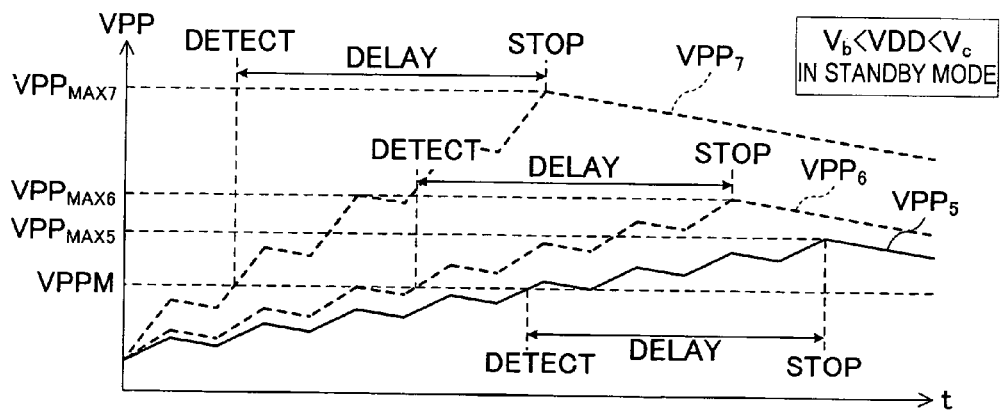

FIGS. 11A to 11C show an outline of the variation of the internal power supply voltage VPP output by the variable resistor circuit 20b. In FIGS. 11A to 11C, the delay period from the time the internal power supply voltage VPP exceeds the standard value VPPM to the time the boosting operation is stopped by the charge pump circuit 12 is set to 3 clocks. In each of the FIGS. 11A to 11C, $VPP_{MAXn}$ (where n is an integer from 1 to 7) denotes a maximum value of the internal power supply voltage VPP in the delay period.

A voltage $VPP_1$ of FIG. 11A is the internal power supply voltage VPP when the external power supply voltage VDD satisfies the magnitude relation $V_b$<VDD<$V_c$ and the internal circuit 30 is in a normal operation. In this case, the mode of the variable resistor circuit 20b becomes the third mode M3.

A voltage $VPP_2$ is also shown in FIG. 11A for the purpose of comparison. The voltage $VPP_2$ is the internal power supply voltage VPP when the mode of the variable resistor circuit 20b is the first mode M1 and the other conditions are similar to those for the voltage $VPP_1$. As is understood from comparing the voltages $VPP_1$ and $VPP_2$, slopes of the voltages $VPP_1$ and $VPP_2$ during the rise are different. Specifically, the rising range of the voltage $VPP_1$ is lower than the rising range of the voltage $VPP_2$ per clock cycle. As a result, the maximum value $VPP_{MAX1}$ of the voltage $VPP_1$ is lower than a maximum value $VPP_{MAX2}$ of the voltage $VPP_2$. That is, an excessive increase in the internal power supply voltage VPP due to the delay is suppressed with the variable resistor circuit 20b according to the second embodiment.

A voltage $VPP_3$ of FIG. 11B is the internal power supply voltage VPP when the external power supply voltage VDD satisfies the magnitude relation $V_e$<VDD and the internal circuit 30 is in a normal operation. In this case, the mode of the variable resistor circuit 20b becomes the sixth mode M6.

A voltage $VPP_4$ is also shown in FIG. 11B for the purpose of comparison. The voltage $VPP_4$ is the internal power supply voltage VPP when the mode of the variable resistor circuit 20b is the first mode M1 and the other conditions are similar to those for the voltage $VPP_3$. As is understood from comparing the voltage $VPP_4$ with the voltage $VPP_2$ of FIG. 11A, maximum value $VPP_{MAX4}$ of the voltage $VPP_4$ is higher than the maximum value $VPP_{MAX2}$ of the voltage $VPP_2$. This is due to a higher external power supply voltage VDD. However, in spite of a higher external power supply voltage VDD, a maximum value $VPP_{MAX3}$ of the voltage $VPP_3$ is suppressed to the same extent as the maximum value $VPP_{MAX1}$ of the voltage $VPP_1$. Thus, with the variable resistor circuit 20b according to the second embodiment, an excessive increase in the internal power supply voltage VPP due to the delay can be appropriately suppressed even if the external power supply voltage VDD varies significantly.

A voltage $VPP_5$ of FIG. 11C is the internal power supply voltage VPP when the external power supply voltage VDD satisfies the magnitude relation $V_b<VDD<V_c$, and the internal circuit 30 is in the standby mode. In this case, the mode of the variable resistor circuit 20b becomes the third mode M3. In addition, the switch element $SW_6$ is turned off. A slope of the voltage $VPP_5$ during the fall has a gentle gradient compared to that of the voltage $VPP_1$ of FIG. 11A. The gentle gradient of the slope indicates that the internal circuit 30 is in the standby mode and that its power consumption is low.

A voltage $VPP_6$ is also shown in FIG. 11C for the purpose of comparison. The voltage $VPP_6$ is the internal power supply voltage VPP when the switch element $SW_6$ is turned on and the other conditions are similar to those for the voltage $VPP_5$. Furthermore, a voltage $VPP_7$ is also shown in FIG. 11C. The voltage $VPP_7$ is the internal power supply voltage VPP when the mode of the variable resistor circuit 20b is the first mode M1 and the other conditions are similar to those for the voltage $VPP_6$.

The voltages $VPP_6$ and $VPP_7$ are equivalent to the voltages $VPP_1$ and $VPP_2$ of FIG. 11A when the internal circuit 30 is in the standby mode. As is understood from comparing FIGS. 11A and 11C, a maximum value $VPP_{MAX6}$ of the voltage $VPP_6$ and a maximum value $VPP_{MAX7}$ of the voltage $VPP_7$ are higher than the maximum value $VPP_{MAX1}$ of the voltage $VPP_1$ and the maximum value $VPP_{MAX2}$ of the voltage $VPP_2$, respectively. This is because the power consumption by the internal circuit 30 is less than that for the example of the voltage $VPP_2$. Thus, an excessive increase in the internal power supply voltage VPP cannot be adequately suppressed by changing the mode of the variable resistor circuit 20b to the third mode M3 alone. However, as shown in the example of the voltage $VPP_5$, an excessive increase in the internal power supply voltage VPP can be adequately suppressed by turning off the switch element $SW_6$. Thus, when the internal circuit 30 is in the standby mode, an excessive increase in the internal power supply voltage VPP due to the delay can be suppressed by switching the modes of the variable resistor circuit 20b according to the external power supply voltage VDD along with turning off the switch element $SW_6$.

Thus, in the semiconductor device 1b according to the second embodiment, the possibility of unnecessarily high voltages being supplied to the internal circuit 30 in the period from the time the internal power supply voltage VPP exceeds the standard value VPPM to the time the boosting operation is stopped by the charge pump circuit 12 is reduced. Furthermore, because the resistance value SR is optimized according to the external power supply voltage VDD, an adequate voltage can be maintained as the internal power supply voltage VPP. In addition, power consumption by a variable resistor in the variable resistor circuit 20b can be reduced. Moreover, even when the internal circuit 30 is in the standby mode, the possibility of unnecessarily high voltages being supplied to the internal circuit 30 can be reduced.

It is apparent that the present invention is not limited to the above embodiments, but may be modified and changed without departing from the scope and spirit of the invention.

For example, in the first and second embodiments, the numbers of modes of the variable resistor circuit are four and six, respectively. However, the numbers of modes need not be limited to these. For example, in the first embodiment, if n−1 (where n is equal to or larger than 2) resistor elements are connected in series in the variable resistor circuit 20a, n resistor elements are used in the voltage dividing circuit 60a, and n−1 comparators are used in the comparison circuit 61a, n modes can be obtained. Similarly, in the second embodiment, if n resistor elements are connected in parallel in the variable resistor circuit 20b, n resistor elements are used in the voltage dividing circuit 60b, and n−1 comparators are used in the comparison circuit 61a, n modes can be obtained.

Moreover, the first embodiment can be configured with the resistor element $R_S$ and the switch element $SW_6$ used in the second embodiment, and enabling variation in the resistance value of the variable resistor according to the power consumption by the internal circuit.

The resistor elements $R_1$ to $R_3$ in the variable resistor circuit 20a are connected in series in the first embodiment and the resistor elements $R_1$ to $R_6$ in the variable resistor circuit 20b are connected in parallel in the second embodiment. However, these are merely examples, and the resistor elements $R_1$ to $R_3$ in the variable resistor circuit 20a in the first embodiment can be connected in parallel, and the resistor elements $R_1$ to $R_6$ in the variable resistor circuit 20b in the second embodiment can be connected in series.

Specific circuit configurations of respective circuits described in the above embodiments are not limited to those explained above, and various other circuit configurations can be also employed as far as they have functions similar to those of the circuit configurations explained above.

What is claimed is:
1. A semiconductor device comprising:
a boosting circuit that boosts an internal power supply voltage according to a level of an external power supply voltage;
a comparison circuit that compares the external power supply voltage and a reference voltage; and
a variable resistor circuit that includes a variable resistor connected to an output terminal of the boosting circuit, the variable resistor circuit further including a first switch element,
wherein the variable resistor circuit controls a resistance value of the variable resistor by turning the first switch element ON in response to a first logic level of a comparison result of the comparison circuit and OFF in response to a second logic level of the comparison result of the comparison circuit, the first switch element being configured to make no response to a clock signal and to be kept ON during the first logic level of the comparison result and OFF during the second logic level of the comparison result.

2. The semiconductor device as claimed in claim 1, further comprising a voltage dividing circuit that divides the external power supply voltage, wherein the comparison circuit compares a divided voltage of the external power supply voltage output by the voltage dividing circuit and the reference voltage.

3. The semiconductor device as claimed in claim 2, wherein the variable resistor circuit sets a first resistance value to the variable resistor when the divided voltage is lower than the reference voltage, and the variable resistor circuit sets a second resistance value to the variable resistor when the divided voltage is higher than the reference voltage, the second resistance value being higher than the first resistance value.

4. A semiconductor device comprising:
  a boosting circuit that boosts an internal power supply voltage according to a level of an external power supply voltage;
  a comparison circuit that compares the external power supply voltage and a reference voltage;
  a variable resistor circuit that includes a variable resistor connected to an output terminal of the boosting circuit, wherein the variable resistor circuit controls a resistance value of the variable resistor based on a comparison result of the comparison circuit; and
  a voltage dividing circuit that divides the external power supply voltage, wherein the comparison circuit compares a divided voltage of the external power supply voltage output by the voltage dividing circuit and the reference voltage,
  wherein the variable resistor circuit sets a first resistance value to the variable resistor when the divided voltage is lower than the reference voltage, and the variable resistor circuit sets a second resistance value to the variable resistor when the divided voltage is higher than the reference voltage, the second resistance value being higher than the first resistance value,
  wherein the variable resistor includes a first resistor element and a second resistor element that are connected in series, and the variable resistor circuit includes a switch element that is connected in parallel to the second resistor element, and sets the variable resistor to the first resistance value by turning on the switch element, and to the second resistance value by turning off the switch element.

5. The semiconductor device as claimed in claim 3, wherein:
  the variable resistor includes a first resistor element and a second resistor element that are connected in parallel,
  the first switch element is connected in series to the second resistor element, and
  the variable resistor circuit sets the variable resistor to the first resistance value by turning on the first switch element, and to the second resistance value by turning off the first switch element.

6. The semiconductor device as claimed in claim 1, wherein the variable resistor circuit controls the resistance value of the variable resistor based also on a value of a current flowing in the variable resistor.

7. The semiconductor device as claimed in claim 6, wherein the variable resistor circuit sets a relatively high resistance value to the variable resistor when the current flowing in the variable resistor is relatively low, and the variable resistor circuit sets a relatively low resistance value to the variable resistor when the current flowing in the variable resistor is relatively high.

8. The semiconductor device as claimed in claim 1, wherein the boosting circuit includes:
  a clock circuit that generates a clock signal; and
  a charge pump circuit that boosts the internal power supply voltage according to the clock signal.

9. The semiconductor device as claimed in claim 8, wherein the internal power supply voltage is output from the variable resistor circuit, and the boosting circuit further includes a control circuit that restricts an operation of the charge pump circuit based on the internal power supply voltage.

10. The semiconductor device as claimed in claim 1, further comprising a smoothing capacitor that is connected between an output terminal of the variable resistor circuit and a ground wiring.

11. The semiconductor device as claimed in claim 1, wherein the reference voltage is a standard value of the external power supply voltage.

12. The semiconductor device as claimed in claim 1, wherein:
  the comparison result comprises first and second comparison signals,
  the variable resistor circuit further includes a second switch element,
  the variable resistor includes a first resistor element and a second resistor element, the first resistor element being connected in series to the first switch element to constitute a first serial circuit, the second resistor element being connected in series to the second resistor element to constitute a second serial circuit, the first and second serial circuit being connected in parallel,
  the first switch element is configured to make no response to the clock signal and to be kept ON during the first logic level of the first comparison signal and OFF during the second logic level of the first comparison signal, and
  the second switch element is configured to make no response to the clock signal and to be kept ON during the first logic level of the second comparison signal and OFF during the second logic level of the second comparison signal.

13. A semiconductor device comprising:
  first and second nodes;
  a boosting circuit that boosts a power supply voltage in response to a clock signal and produces an output voltage at the first node;
  an internal circuit coupled to the second node;
  a voltage detection circuit detecting a level of the power supply voltage to produce a detection signal; and
  first and second circuits coupled in series between the first and second nodes,
  the first circuit comprising a first resistive element and a first switch coupled in parallel to the first resistive element, the first resistive element representing a resistance value that makes no response to any one of the clock signal and the detection signal, and
  the second circuit comprising a variable resistance circuit that represents a variable resistance controlled by the detection signal.

14. The semiconductor device as claimed in claim 13, wherein the device operating in one of a standby mode and a normal mode, and the first switch element being turned OFF in the standby mode and ON in the normal mode.

15. The semiconductor device as claimed in claim 14, wherein the variable resistance circuit comprises a second resistive element and a second switch element connected in parallel to the second resistive element, and the second switch element being brought into one of ON and OFF states in response to the detection signal.

16. The semiconductor device as claimed in claim 15, wherein the variable resistance circuit further comprises a third resistive element connected in series to the second resistive element and a third switch element connected in parallel to the third resistive element, and a selected one of ON and OFF states of each of the second and third switch elements being controlled in response to the detection signal.

17. The semiconductor device as claimed in claim 14, wherein the variable resistance circuit comprises a second resistive element and a first serial circuit connected in parallel to the second resistive element, the first serial circuit comprising a second switch element and a third resistive element connected in series, and the second switch element being brought into one of ON and OFF states in response to the detection signal.

18. The semiconductor device as claimed in claim 17, wherein the variable resistance circuit further comprises a second serial circuit connected in parallel to the second resistive element, the second serial circuit comprising a third switch element and a fourth resistive element connected in series, and a selected one of ON and OFF states of each of the second and third switch elements being controlled in response to the detection signal.

19. The semiconductor device as claimed in claim 14, further comprising a smoothing capacitor connected between the second node and a third node that is fixed to a ground potential.

* * * * *